United States Patent [19]

Aubert

[11] Patent Number: 4,847,985
[45] Date of Patent: Jul. 18, 1989

[54] METHOD FOR MAKING A GRADIENT COIL
[75] Inventor: Guy Aubert, Grenoble, France
[73] Assignee: Thomson-CGR, Paris, France
[21] Appl. No.: 918,882
[22] Filed: Oct. 15, 1986
[30] Foreign Application Priority Data
  Oct. 18, 1985 [FR] France ............................. 85 15510
[51] Int. Cl.⁴ ............................................ H02K 15/04
[52] U.S. Cl. ........................................ 29/605; 29/602.1
[58] Field of Search ............................. 29/605, 602.1
[56]  References Cited
  U.S. PATENT DOCUMENTS
  4,403,489  9/1983  Munsterman et al. ........... 29/605 X
  4,580,336  4/1986  Kerley et al. ...................... 29/605
  4,747,288  5/1988  Fritzsche ........................... 29/605 X FOREIGN PATENT DOCUMENTS
  0096516 12/1983  European Pat. Off. .
  1946059 10/1968  Fed. Rep. of Germany .
  2290748 11/1974  France .
  2411478 12/1978  France .
  2473215  1/1980  France .
  2549281  6/1983  France .

Primary Examiner—Timothy V. Eley
Attorney, Agent, or Firm—Oblon, Spivak, McClelland, Maier & Neustadt

[57] ABSTRACT

To make a gradient coil, it is decided to cut the conductors of this coil out of a plate. Thus flat conductors can be used. This helps reduce the self-inductance of the coil to be made. The coil is, moreover, optimized. A calculation is made of the coefficients of the breakdown into spherical harmonics of the field created by the coil. The coil's structure is modified so as to cancel those coefficients of this breakdown which generate a divergence in this field. It is shown that, in this way, the solution is an optimum one.

13 Claims, 4 Drawing Sheets

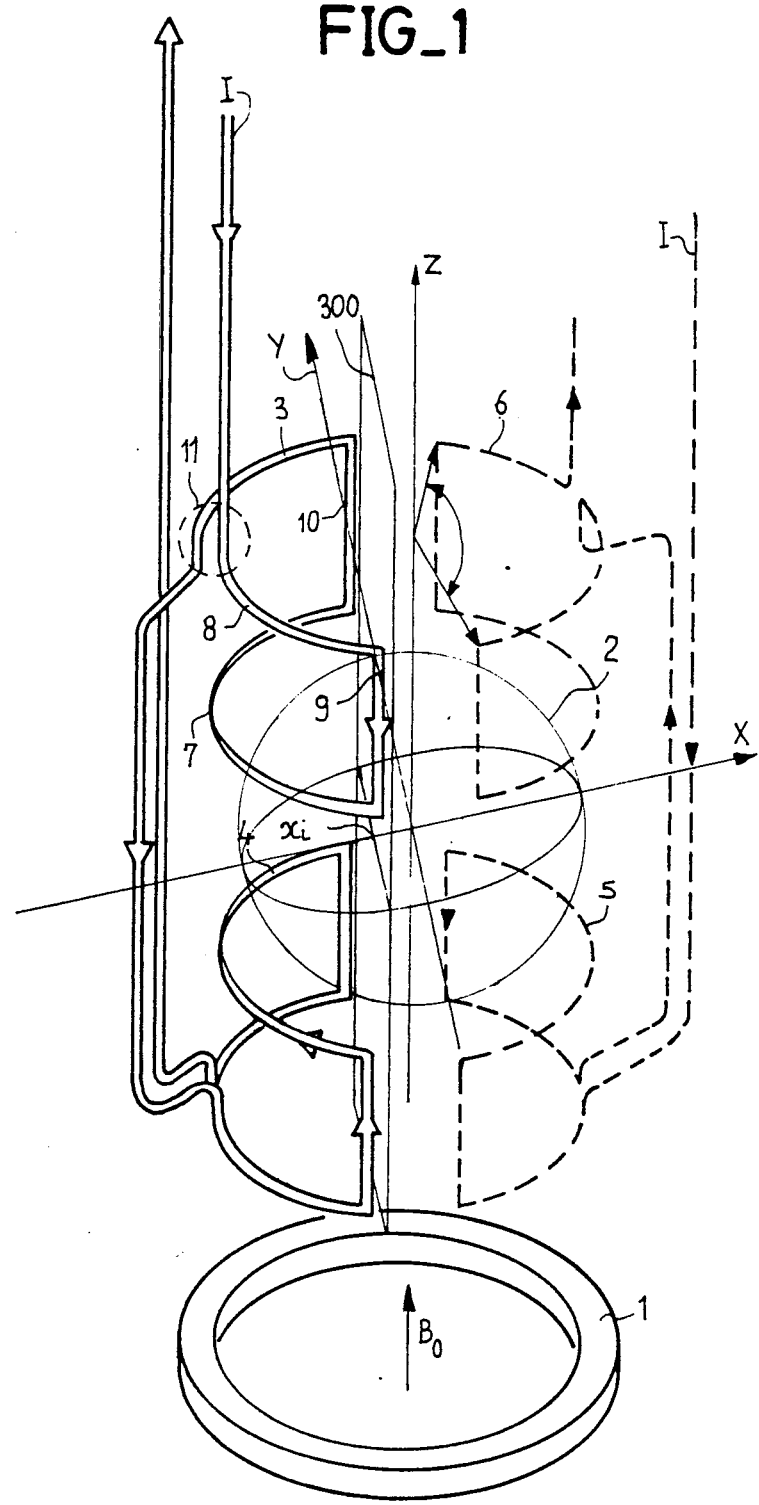
FIG_1

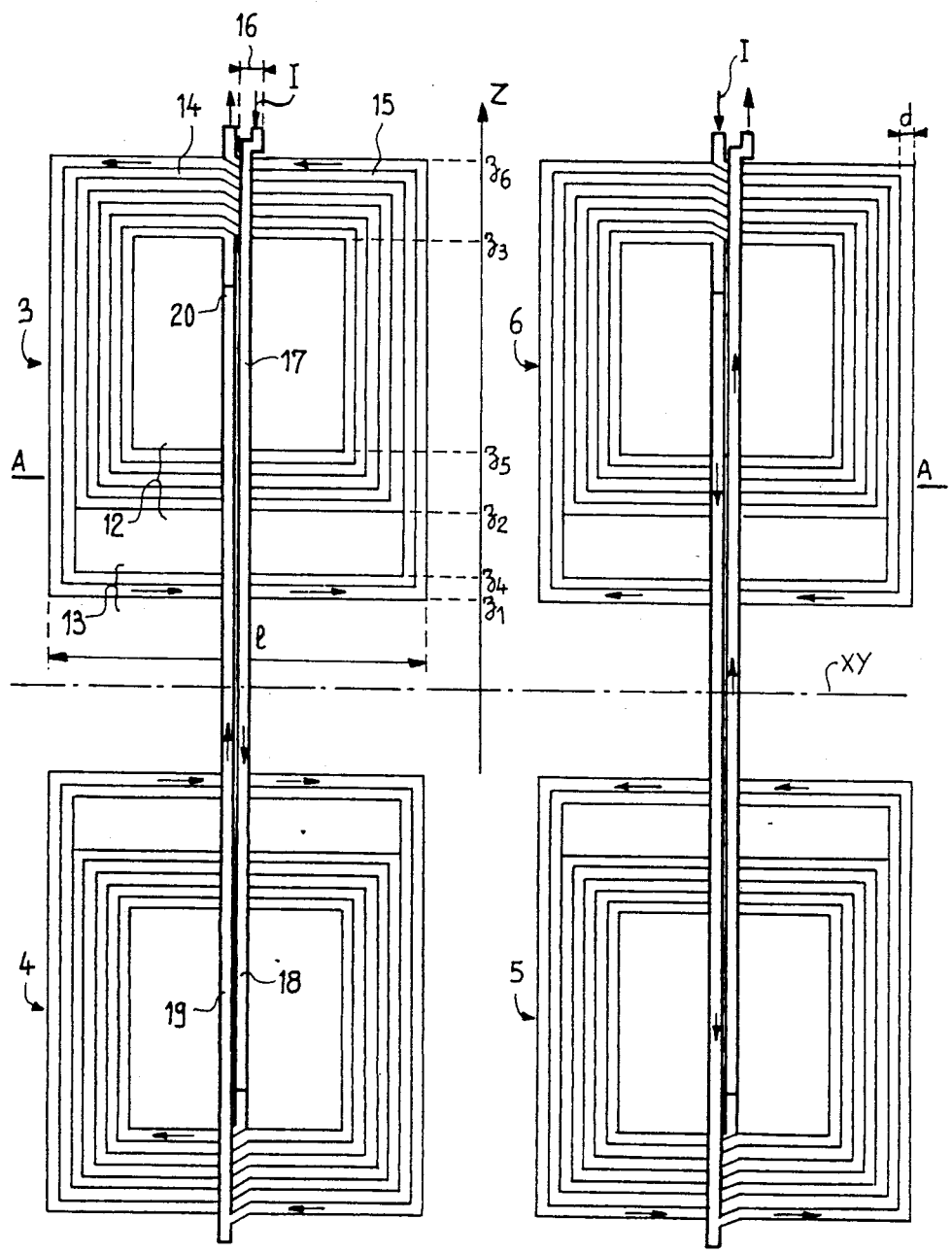
FIG_2

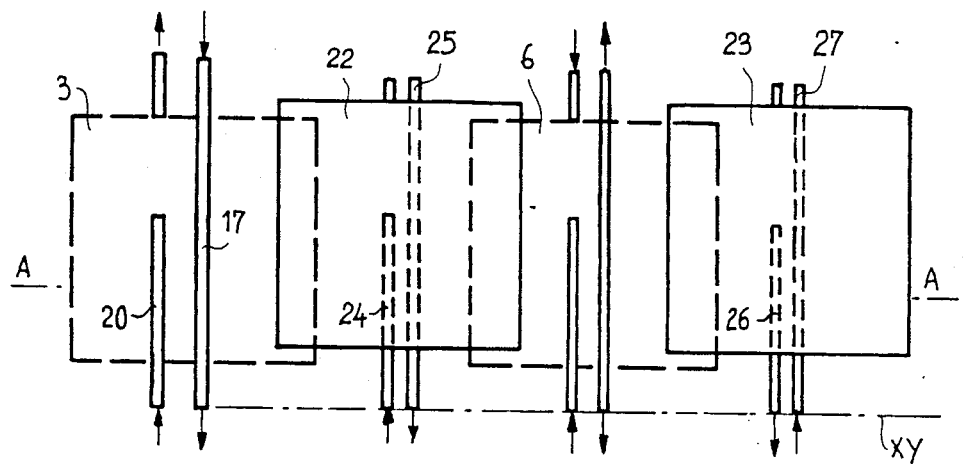
FIG_3
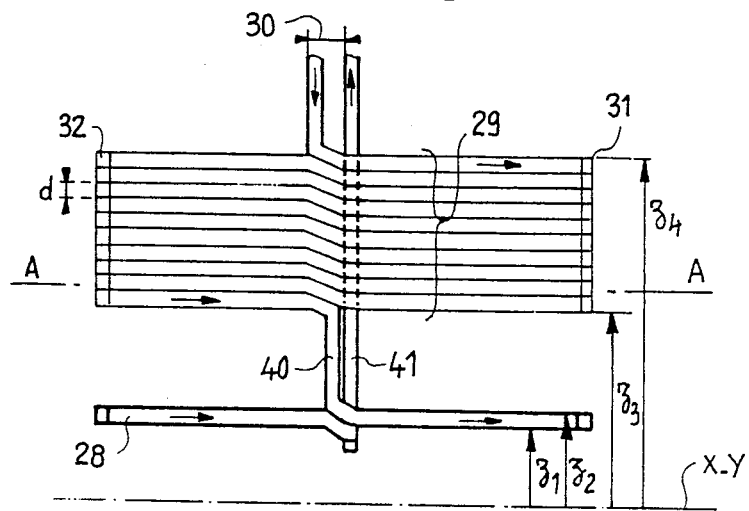
FIG_5

FIG_4
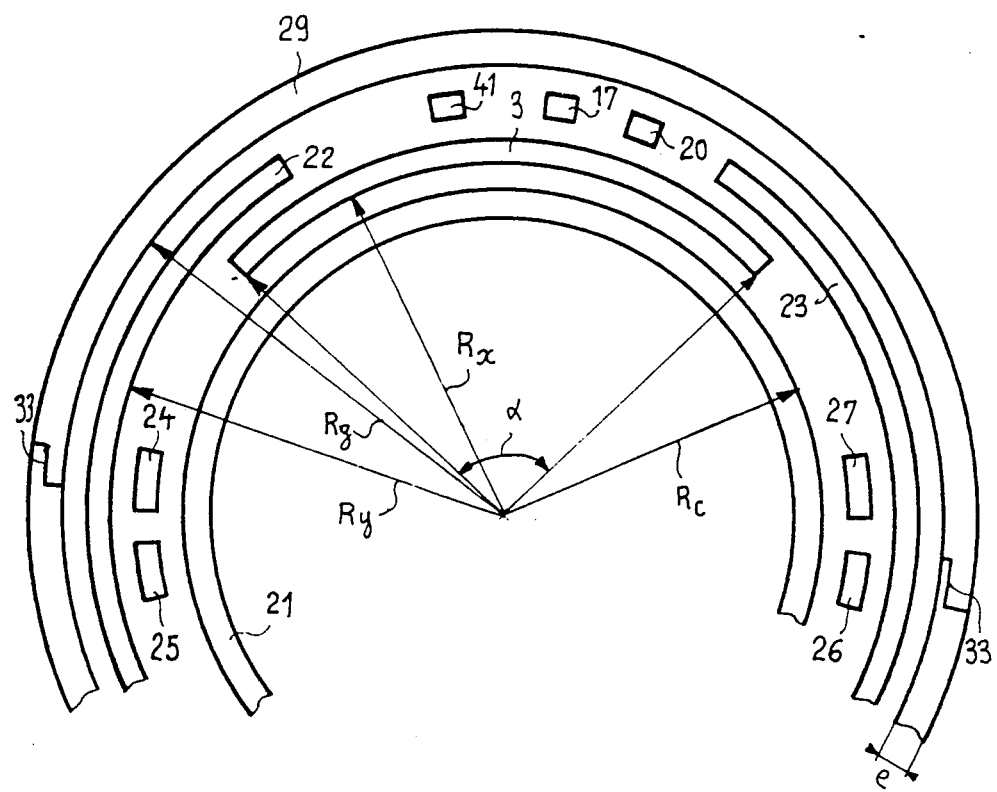

METHOD FOR MAKING A GRADIENT COIL

BACKGROUND OF THE INVENTION

The object of the present invention, which results from the collaboration of the Service National des Champs Intenses (national department for the study of strong fields: Director, M. AUBERT) is a method for making a gradient coil as well as a gradient coil obtained by this method. This gradient coil is designed to create a magnetic field gradient in a volume covered by a nuclear magnetic resonance device for the formation of optical images. The invention has special application in the medical field where optical image formation by nuclear magnetic resonance is unanimously acknowledged to be a diagnostic aid. Of course, it can be used in other fields. The goal of the present invention is to help in the creation of images, of a body to be examined, which are more faithful and more precise in their resolution.

A device for optical image formation by nuclear magnetic resonance comprises essentially three types of coils. An initial type of coil (which may be replaced if necessary by a permanent magnet) is aimed at creating a strong, homogenous, magnetic field $B_0$ in a pre-determined space of interest. A second type of coil, known as a radiofrequency coil, is aimed at subjecting a body, which is examined and placed under the influence of the field of the first coils to radiofrequency excitation sequences and at measuring a radiofrequency signal transmitted in return by the particles of the body. The radiofrequency response is a response in volume: all the particles of a region of the body subjected to the examination transmit their radiofrequency responses at the same time. To create an image, it is necessary to differentiate these responses. To this end, optical image formation devices comprise a third type of coils, known as gradient coils, to superimpose the component of an additional magnetic field on the the strong field. The value of these components is a function of the coordinates in space of their place of application (conventionally, it is proposed to structure this differentiation along three mutually perpendicular axes, X, Y and Z; by convention, the axis Y is even generally taken as being co-linear with the strong field created by coils of the first type). In other words, each location of the space may be coded by a different field value; the modifications that result from this are exploited in the re-transmitted signal to create the image.

Gradient coils are generally divided into three classes: those that create a gradient along X, those that create a gradient along Y and those that create a gradient along Z. For example, a field gradient along X is a magnetic field for which the distribution of the co-linear component at the strong field (Z) in space is a function solely of the coordinate $x_i$ of its place of application. In practice, it is preferably even proportionate to this coordinate. This means that all the particles of a body to be examined, located in a plane parallel to Y-Z and with a given abscissa $x_i$, are subjected to one and the same total field $B_0 + G_x \cdot x_i$. The gradient $G_x$ is the slope of the variation of the component along Z of the additional field provided by these X gradient coils.

The acquisition of an image, therefore, requires, during the application of radiofrequency excitation sequences, the concomitant application of field gradient sequences. The field gradient sequences depend on the method of optical image formation used. This method may, for example, be of the 2DFT type prepared by Mr. A. KUMAR and Mr. R. R. ERNST or, for example, of the back projection type prepared by Mr. P.,C., LAUTERBUR. Regardless of the method of optical image formation chosen, one characteristic of field gradients is that they are pulsed. They are set up, they persist for a short period and then they are cut off. This may occur one or more times during each sequence. The consequence of this specific feature is that the functioning of the coils which produce them must be studied not only during permanent operation, during the application of the gradients, but also during the transients which result from their establishment and their cutting off. Another major characteristic of field gradients relates to their homogeneity. Homogeneity is taken to mean compliance with a given tolerance value and, through a real field gradient, compliance with an ideal theoretical distribution which is sought to be imposed: the divergence of the field results in falsifying the differentiation that is sought to be imposed in space, this differentiation being the very basis of optical image formation. From this point of view, problems of homogeneity have to be resolved as much for the gradients as for the strong, homogeneous fields. The solution of the problems raised by transients is resolved, in principle, by making coils as small as possible. The smaller they are, the lower is their self-inductance and the smaller is the amount of power needed to produce the field gradient. In contrast, for homogeneity, the bigger the coils, the more can the distribution of the fields that they produce be considered to be homogeneous. These two tendencies are, therefore, contradictory. In general, the gradient coils are placed outside, as near as possible to the radiofrequency coils. These coils determine, in their interiors, the volume of examination in which the body is placed. The problem to be resolved then, for an imposed location, is to find gradient coils which produce a sufficiently steep ($G_x$) homogeneous gradient and which have low self-inductance.

DESCRIPTION OF THE PRIOR ART

Special forms of gradient coils are known in the prior art. For example, for a gradient $G_x$ or $G_y$, these coils comprise conductors shaped around a cylinder in so-called saddle-shaped contours. The coils of the invention are, in particular, of this type but have specific features designed to provide the best solution to the threefold problem of force, homogeneity and the electric power to be used. For many theoretical and technological reasons, strap-braided conductors are sometimes used in coils. A strap-braided conductor is a conductor with a rectangular cross-section, with a ratio of approximately 2 between the sides. This use is derived from the fact that calculations for coils are done using theoretical conductors with a cross-section of zero. And in building the coil, this theoretical shape is approached by a cylindrical or even flattened shape. Besides, strap-braided conductors are unsuitable for being formed in a plane that contains the big dimension of their cross-section. Forming becomes even very difficult if the ratio between the sides is greater than 2.

SUMMARY OF THE INVENTION

The object of the invention is to remedy the disadvantages referred to by making a coil, the conductors of which are cut out of a plate made of conducting material. The thickness of the plate, obtained by rolling the conducting material (which is essentially copper) then has a constancy which is sufficient for the cross-section of the conductors to depend solely on the width to which they have been cut out. Thus, flat conductors are made in a simple way: i.e. conductors in which the ratio of the small dimension of the cross-section to the big dimension of the cross-section is high, approximately greater than 5. This results in diminishing of the conductor's skin effect during switching since the flat conductor has a lot of skin area. The electric power needed to set up the field is thus reduced. In other words, the transient functioning of the gradient coil is thus enhanced. Furthermore, it has been possible in the invention to reduce the number of cutouts and the quantity of scrap material by making coils with adjacent conductors. For a sufficient number of conductors, there is only one equal number (plus one unit) of cutouts and conductors. It is therefore, not necessary to cut all the conductors out of the plate on both their sides.

The invention concerns a method of embodiment of a gradient coil to create a magnetic field gradient in a volume covered by an apparatus for optical image formation by nuclear magnetic resonance, wherein:

The dimensions, architecture and number of turns in the coil are optimized by choosing flat conductors, The coil thus determined is cut to shape by making cutouts in sheets of conducting material, the thickness of which corresponds to a characteristic of the coil conductors, And wherein, the coil thus cut out is put into final shape around a cylindrical chuck.

The invention also pertains to a gradient coil to create a magnetic field gradient in a volume covered by an apparatus for optical image formation by nuclear magnetic resonance, comprising turns of which the number, architecture and dimensions are optimized so that they are capable of producing the steepest and the most homogeneous gradient possible in the volume covered while displaying, in the pulsed mode, the weakest possible resistance to the setting up of the current.

BRIEF SUMMARY OF THE DRAWINGS

The present invention will be better understood from the following description and the figures that accompany it. The description and figures are given solely as an indication of the invention and are in no way exhaustive. The figures use the same references to designate the same elements. The figures are:

FIG. 1, a diagram of an apparatus for optical image formation by magnetic resonance equipped with gradient coils;

FIG. 2, a schematic, evolute view of an example of an embodiment of a coil belonging to an initial class of gradient coils according to the invention;

FIG. 3, a schematic, evolute view of gradient coils of two classes and their specific types of connection;

FIG. 4, a section view of three classes of gradient coils in an embodiment according to the invention, the coils being mounted on a circular, cylindrical chuck;

FIGS. 5, an example of a gradient coil according to the invention for the third class.

FIG. 1 depicts an apparatus for optical image formation by nuclear magnetic resonance. It comprises means, symbolized by a coil 1, to produce a strong, homogeneous, magnetic field $B_0$ which is oriented in a direction Z. A body to be examined (not depicted) is placed at least partly in a volume under examination 2 subjected to the influence of the field $B_0$. This body is subjected to radiofrequency excitation sequences by radiofrequency coils (not depicted). These radiofrequency coils are also used to receive the signal sent back by the particles of the body. This signal is processed by signal-processing means (not depicted) which extract from it images which are representative of the aspect of the body, for example along sections 300 of the abscissa $x_i$. The planes of the section, such as 300, may be directed in any particular way. Their orientation reveals field gradients which have been superimposd on the field $B_0$ during the optical image formation sequences. Two mutually perpendicular axes X,Y and the axis Z are used to structure the space. A coil gradient, numbered 3 to 6, of an initial class, is capable of producing an additional magnetic field, of which the component oriented along Z varies as a function of the abscissa $x_i$. The coil depicted is, therefore, a gradient coil X. Conventionally it comprises four substantially identical and symmetrical sets 3 to 6 of saddle-shaped conductors. For example, the set 3 has a conductor comprising two arch-shaped strands, 7 and 8 respectively, connected to each other by two straight strands, 9 and 10 respectively, co-linear with the generators of a circular cylindrical chuck (not depicted) which carries it. For reasons of symmetry, all four sets of conductors have the same current I flowing through them. For reasons of simplicity, there is even provision for powering several sets in series: for example, sets 3 and 4 and sets 5 and 6. The direction in which the current flows in the conductors is chosen so as to produce the field gradient sought.

It can be shown that only the component along Z of the additional field created has an influence for as long as the additional fields remain weak with respect to the strong field $B_0$ (for example, at a hundredth of it). The components that are perpendicular to $B_0$ have no effect. Consequently, the fields produced by the straight strand 9 and 10, parallel to $B_0$, are automatically perpendicular to $B_0$: they have no effect. Besides, since the conducting arch 7 is closer to the volume covered by the apparatus than the conducting arch 8, the field that it produces is stronger. Hence, the connecting mechanisms of sets such as 11 are, in a preferred method, arranged in recessed conducting hoops: i.e. at a place where their presence causes the least disturbance. A coil of a second class, producing a field gradient along Y, has the same shape as a coil producing a gradient along X. It is simply turned by 90° around the axis Z. For reasons of space, its internal diameter is greater: it partly envelopes the coil X. The reason it is not shown is to avoid crowding the figure. The coil of the third class of gradient coils along the axis Z comprises sets of conductors which are symmetrical with respect to the plane X-Y. These conductors are all hoop-shaped and are traversed by a current which has the same intensity but which flows in the opposite direction on either side of the plane X-Y.

The invention involves making the coils of all three classes by cutting them out of plates made of conducting material. In a preferred method, these plates are made of copper and their thickness is about 1% or less of the internal radius of the cylinder which will subsequently bear the coils. It has been discovered that the flatter the conductors, the weaker is the influence of the intrinsic skin effect. In a preferred method, flat conductors are chosen, the width d of which is at least five times their thickness e. In a preferred example, the width is even 8.5 times this thickness. Since the strength of the field gradient and the covered volume on which it is sought to be imposed are known, it is easy to approach the value of the induction current needed to obtain it. It is enough to apply the laws of electromagnetism. Since the resistivity of the material used (copper) is known, it is then possible to calculate the section of the conductor to be presented: i.e. the thickness e and the sum of the strand widths of the conductors in each set.

FIG. 2 shows a preferred embodiment of a coil of the first or second class (gradients X or Y). In the depiction, this coil has been unrolled flat. Each set marked 3 to 6 comprises two groups marked 12 and 13 of spiral-shaped conductors. Each group comprises a certain number of turns. In one example, the group 12 has five of these and the group 13 has two. In the invention, the group 12 is intertwined with the group 13 and the even the turns of groups 12 and 13 are intertwined with one another. Thus they can all be formed from one and the same plate. At the same time, this method provides for their electrical inter-connection. In a preferred method, the turns are adjacent to one another, and the groups are adjacent to one another. In this way, it is enough to make a single cutout in the plate along each conductor to differentiate it from a neighbouring conductor.

The intertwining here is in the shape of a square spiral. Since, when the connection is made, two turn strands, for example, 14 and 15, are connected to turns at higher and lower levels in the spiral, they contribute to setting up one and the same arch. To prevent them from being placed at different coordinates $z_i$, a sliding space 16 has been provided. Each conductor end which comes to this space 16 is slightly deflected here so that it continues along a hoop located at a lower or higher degree of the spiral. It can be shown that, since these connections are all parallel with one another and also adjacent, their overall influence is negligible. As a precaution, the sliding space is made on the recessed arches.

A current-input conductor strand 17 is connected to a corresponding conductor strand 18 in the centre of the spiral 4. The conductor 18 is in the extension of the conductor 17 (so as to avoid creating a current parasite component perpendicular to the axis Z which would automatically create a divergence of the component $B_Z$ of the additional field). The conductors 17 and 18 can pass exactly above the median of the sets to which they belong. In this condition, the four sets 3 to 6 are exactly identical to one another. After flowing through the set 4, the current returns by the conductors 19 and 20 which are parallel to the conductors 17 and 18. After crossing the spiral 3, it comes out on the side of the input strand 17. The input and output are connected in a conventional way to power supply means.

Since the turns are cut out of plates, the conductors 17 and 18 follow, for their connection, a plane which is higher or lower than that in which the sets 3 to 6 are placed. The FIG. 3, depicted in an evolute form, and the FIG. 4, which is a section view along a plane AA which is perpendicular to the axis Z and is located substantially to the right of the group 12, describe the way in which the gradient coils X and Y are structured. The sets 3 and 6 are placed against a circular chuck 21 made, for example, of epoxy resin reinforced with fibre glass. The chuck 21 acts as a support; the coil X is bonded to it by means of a bonder comprising fibre glass impregnated with polymerizable material. The radiofrequency coils are hooked to its interior (they are not depicted). The conductors 17 and 20 are placed above the middle of the set 3, bonded for example, by an identical bonder.

The ring on which the conductors 17 and 20 are located is occupied, on either side by sets, 22 and 23 respectively, of a coil with the task of producing the field gradient Y. The power supply conductors 24-25 and 26-27 of these latter sets are diametrically opposite to one another and let a symmetrical current flow through. These conductors 24 to 27 occupy that part of the ring which is left unoccupied by the sets 3 and 6 of the coil X. They are subjacent to the sets 22 and 23. The sets and power supply conductors of the coils of the first two classes are therefore, placed at two levels. FIG. 4 shows the radius $R_c$ of the exterior of the chuck, the radius $R_x$ of the interior of the gradient coil X, and the radius $R_y$ of the interior of the gradient coil Y. These radii are deducted from one another by taking into account, on the one hand, the thickness of the conducting plates and, on the other hand, the thicknesses of the bonder used.

FIG. 4 also shows an internal radius $R_z$ of the sets of conductors of the gradient coil Z, seen in a partly evolute form in FIG. 5. The gradient coil Z comprises two sets of conductors which are symmetrical with respect to the plane X-Y. Here one set alone is depicted. In a preferred embodiment, each set comprises two groups of conductors. In one example, an initial group 28 comprises one conductor and a second group 29 comprises ten of them. The ten conductors of the group 29 are adjacent to one another: eleven cutting-out operations are needed to differentiate the ten conductors of the grouping 29. The conductors of the coil Z are hoop-shaped. So as to be powered in a series, they are successively connected to one another. At the connection between them, these conductors also have a sliding space 30. In the sliding space 30, the end of one hoop is connected to the beginning of a following hoop. In their installation around the chuck 21, the return conductors, like the conductors 41 (FIGS. 4 and 5), are located in the ring of the coil Y (and the return conductors 20 and 17 of the coil X). The three coils fit into three levels.

All the hopes of one set can be formed out of one plate and, after shaping, the ends 31 and 32 of each hoop can be made to abut electrically. The shaping here is done, as for the coils X and Y, in rolling machines after cutting out. These rolling machines, described in outline, comprise two rollers facing each other and working at different speeds. The plates, once cut, are slipped in between these rollers and are curved along a radius of curvature which depends on the difference in speeds. For easier shaping, it is preferred, however, to make the hoops in two parts: the part depicted in FIG. 5 and another part, not depicted, which quite simply comprises eleven straight segments of equal length. Each part is shaped according to an equal semi-circumference and each arch of a part abuts a corresponding conductor arch of the other part. For easier electrical connection of the ends 31 and 32, the arches may comprise an inside recess as shown in 33 in FIG. 4.

The cutting out operations in the plates are done, according to a preferred method, before shaping. Since the cutting out is rectilinear, it can be done in various ways: with a milling machine, a saw or even by laser. According to a preferred method, they are made with a nibbling machine. For easier shaping and to prevent the conductors from being twisted in an undesired way, bridge pieces are left at intervals in the cut-out material and are later removed.

Having thus laid down constraints that are related more to manufacturing imperatives than to those of homogeneity, of minimum self-inductance or of the highest possible field gradient for the coils considered, we shall now try, in the invention, to calculate the dimensions of the elements of these coils which will make it possible to meet these constraints. The calculating method used is an original one. It consists in using a development, in spherical harmonics, of the reduced component, along Z, of the additional field imposed by any particular coil at a given location of spherical coordinates: r, $\theta, \phi$. This breakdown is written as follows:

$$\frac{B_z(r,\theta,\phi)}{B_s} = H_o + \tag{1}$$

$$\sum_{n=1}^{n\infty} \left(\frac{r}{r_o}\right)^n \left[\sum_{m=1}^{m=n} I_n^m \cos m\phi \sqrt{\frac{(n-m)!}{(n+m)!}} \; P_n^m (\cos\theta)\right] +$$

$$\sum_{n=1}^{n\infty} \left(\frac{r}{r_o}\right)^n \left[\sum_{m=1}^{m=n} J_n^m \sin m\phi \sqrt{\frac{(n-m)!}{(n+m)!}} \; P_n^m (\cos\theta)\right] +$$

$$\sum_{n=1}^{n\infty} \left(\frac{r}{r_o}\right)^n [H_n P_n (\cos\theta)]$$

In this formula $B_z$ is the component along Z of the total additional field created by the coil, $B_s$ is a reference field used to define coefficients $H_n$, $I^m_n$ and $J^m_n$ which are without dimensions. The reduced radius $r/r_0$ measures the modulus of the distance r from any particular point of the sphere 2 to the radius $r_0$ of this sphere. The functions $P_n (\cos\theta)$ and $P_n (\cos\theta)$ are polynomials of Legendre, respectively of the order n and with proper values n and m. The coefficients $H_n$, $Im/n$ and $Jm/n$ depend on the geometrical structure of the coil. Depending on the symmetries and anti-symmetries of the structures, certain coefficients disappear from the above expression. Thus, for the gradient X, this expression becomes:

$$\frac{B_z(r,\theta,\phi)}{B_s} = \left(\frac{r}{r_o}\right) I_1^1 \cos\phi \sqrt{\frac{1}{2!}} \; P_1^1 (\cos\theta) + \tag{2}$$

$$\left(\frac{r}{r_o}\right)^3 I_3^1 \cos\phi \sqrt{\frac{2!}{4!}} \; P_3^1 (\cos\theta) +$$

$$\left(\frac{r}{r_o}\right)^3 I_3^3 \cos 3\phi \sqrt{\frac{1!}{6!}} \; P_3^3 (\cos\theta) +$$

$$\left(\frac{r}{r_o}\right)^5 I_5^1 \cos\phi \sqrt{\frac{4!}{6!}} \; P_5^1 (\cos\theta) +$$

$$NI_5^3 + MI_5^5 + \ldots$$

In this formula the only remaining $Im/n$ are those for which n and m are odd-numbered, m being equal to or less than n. All the $Jm/n$ and $H_n$ are nil. For the gradient Y, I is replaced by J and the expression has substantially the same aspect. For the gradient Z, the only remaining terms are in $H_n$. The expression is $$\frac{B_z(r,\theta,\phi)}{B_s} = \left(\frac{r}{r_o}\right) H_1 P_1 (\cos\theta) + \left(\frac{r}{r_o}\right)^3 H_3 P_3 (\cos\theta) + \tag{3}$$

$$\left(\frac{r}{r_o}\right)^5 H_5 P_5 (\cos\theta) + \ldots$$

To calculate the various coefficients H, I or J, we have parameters of structure relating to the coils. For the gradient coils X and Y, these are the altitudes $z_i$ and $z_j$ at the edge of the arches of each turn and also the angular openings $\alpha$ of each turn. For the gradients Z, these are solely the altitudes $z_i$ of the edges of each hoop. The thickness e comes into play only it is small enough to correspond to the case of theoretical conductors with an ideal thickness of zero. Further constraints relating to the non-overlapping of the turns and to the space occupied are laid down by the choice of manufacturing techniques according to the invention. Their effect is only to limit the number of solutions that can be envisaged.

We shall now describe the method used to determine and optimize the architecture of the conductors according to the invention. This method consists in first choosing the width d of the conductors and then in making the gradients as homogeneous as possible while, at the same time, producing the steepest gradient possible for a given current. For example, the gradient Z is said to be homogeneous to the order of 5 when the terms $H_3$ and $H_5$ of the formula (3) are nil. In this particular case of homogeneity to the order of 5, it is shown that each set of the gradient coil Z, located on either side of the median plane X-Y should be made up of two groups of hoops comprising numbers $n_1$ and $n_2$ respectively of hoops. It has been discovered that for a given $n_1$, the result was reached only for values of $n_2$ greater than a certain minimum value, substantially greater than $n_1$. For example, for $d=0.069 \; R_z$ and $n_1=1$, the result can be arrived at only for $n_2 \geq 8$, if $n_1=2$, there must be $n_2 \geq 18$ etc.

The power supply constraints related to the transients when setting up or cutting off the gradients make it necessary to reduce the self-inductance of the structure. It can be shown that this self-inductance increases with $n_1$ and $n_2$. Since the rise time of the gradients (which is dictated by the chosen optical image formation sequence) and the characteristics of the available generators are known, it is possible to calculate a self-inductance limit (which is not to be exceeded) for the gradient coil Z. This determines the couple $n_1$-$n_2$ which gives the greatest $H_1$ while at the same time remaining below the threshold imposed by the self-inductance limit which should not be exceeded. In a preferred embodiment, $n_1=1$ and $n_2=10$ were chosen. If we call $z_1, z_2, z_3$ and $z_4$ the altitudes of the edges of each of these two groups of conductors of the gradient coil Z (FIG. 5) and if we assume a constraint of adjacency on the hoops to be cut out of a plate, we choose $z_1=0.256347 \cdot R_z$, $z_3=0.893059 \cdot R_z$, and $d=0.069 \cdot R_z$. The coordinates $z_2$ and $z_4$ are simply deducted.

For the gradient coils X or Y, the procedure is the same. For example, for the gradient X, it is necessary to obtain an $I1/1$ maximum while, at the same time cancelling $I4/3$ and $I3/3$ to get a homogeneous gradient of the order of 3. This is possible for a coil in which each of the four sets comprises a single group of turns. With two groups of conductors in each set, as depicted in FIG. 2, it is possible to increase the homogeneity by further cancelling I1/5 and laying down additional constraints related to manufacturing technology. In particular, it may be laid down that the conductors must all be of the same width and they should not overlap.

As for the gradient Z it is sought, after having chosen a width d and for each couple $n_1$-$n_2$ of the number of turns in each group, to obtain the dimensions for which I1/3, I3/3 and I1/5 are nil while, at the same time, making I1/1 maximum. Then, in view of the imperatives of the self-inductance limit which must not be exceeded, a limit couple and optimum dimensions are deduced from it. In a preferred solution $n_1=2$, $n_2=5$, $d=0.69\ R_x$ and the altitudes of the projection $z_1$, $z_2$, $z_3$ of the edge of the arches (those arches of the edges which are closest to the median plane X-Y which is perpendicular to Z at the centre of the sphere (2) are respectively (FIG. 2): $z_1=0.111393R_x$, $z_2=0.567901R_x$ and $z_3=2.383976R_x$. In this case, the width 1 of each set is equal to $2.306872R_x$. From this we deduce the altitudes $z_4$, $z_5$ and $z_6$ knowing $n_1$, $n_2$ and d. For the gradient coil Y, we replace $R_x$ by $R_y$.

The method used to determine the conductors of the invention differs from those used in the prior art. In this method there is no calculation of the coefficients of the breakdown, into spherical harmonics, of the field component Z. These components are themselves calculated along Z. For a theoretical structure of coils (saddle-shaped for the gradients X or Y) we arrive at a typical field distribution card in the planes. At this point, the specialist's sagacity comes into play to weight the effect of one saddle by the effect of another saddle. Thus, a succession of saddles is added and the requisite homogeneity is obtained. In doing so, however, there is no certainty whatsoever of having reached an optimum of homogeneity, of minimum self-inductance and of the steepest gradient. Besides, this optimum is not obtained in practice. The specialist's manipulations all lead him in the end to accumulate additional turns of various shapes. This is always done to the detriment of the coil's self-inductance. Depending on the specialist's ideas and the priorities that he put forward, he discovers different solutions. The method of determination proposed by the invention can be used to arrive at the optimum in a sure manner. Depending on the technological choices made, R and d, we are now capable of proposing the structure that presents the maximum gradient ($H_1$ or I1/1 or J1/1) at the same time as the minimum self-inductance and the highest degree of homogeneity.

The thickness e comes into play only to fix the mean power dissipated through the system during the various optical image formation sequences. Its choice flows from a compromise between on the one hand, this power which is inversely proportionate to e and, on the other hand, the mass of the conductor and manufacturing difficulties (cutting out, rolling, bonding, etc.) which increase with e. In the preferred embodiment, $e=3$ mm.

What is claimed is:

1. A method for making a gradient coil, formed from a conductive material to create a magnetic field gradient in a volume by way of an inductive current flowing through said conductive material covered by an apparatus for optical image formation by nuclear magnetic resonance comprising:

forming ac oil whose dimensions, architecture and number of turns are determined by choosing flat conductors having a predetermined thickness and a predetermined width, continuously cutting turns for said coil from a sheet of conducting material into a spiral form, the thickness of which corresponds to the thickness of the flat conductors of the coil, with each of the cut turns being spaced apart from each other by a width equal to the width of said first conductors, placing the coil around a chuck.

2. The method according to claim 1 wherein conducting strands of said coil are chosen with a width at least five times greater than its thickness.

3. The method according to claims 1 or 2 wherein the thickness of the flat conductors of the coil is less than or equal to 1% and the width of the flat conductors are in ratios that are less than 7% respectively to each other, and substantially equal to 1% at the most and 7% of the radius of said chuck that shaped them.

4. The method according to claims 1 or 2 wherein said coil, is made in two intertwined groups of intertwined turns and wherein the dimensions and number of turns in each group are calculated so as to make fields generated homogeneous.

5. The method according to claim 4 wherein, for the intertwining, a choice is made to set up adjacent groups of adjacent turns, all in one and the same plane.

6. The method according to claims 1 or 2 wherein, said coil, is made up of conductors in two groups of adjacent turns and wherein, the number of turns of each group is calculated so as to make fields generated homogeneous.

7. The method according to the claim 4 wherein to make said calculation:

couples, which are defined as a tried couple of numbers with a number of couples representing the number of conductors tried for a given group are chosen for the numbers of conductors to be arranged in the groups;

calculating a set of coefficients, corresponding to the chosen couples, of the breakdown of a generated field to be created into spherical harmonics;

setting apart those couples of conductor numbers that given these coefficients pre-determined values up to a given order; and determining the number of conductors in each group by taking those of the couples set apart that give the steepest gradient with a self-inductance smaller than a fixed threshold corresponding to a transient operation of the coil thus made.

8. The method according to claims 1 or 2 wherein a plurality of sheets of the same thickness are chosen.

9. The method according to claims 1 or 2 wherein a laser is used for cutting out.

10. The method according to claims 1 or 2 wherein a milling machine is used for cutting out.

11. The method according to claims 1 or 2 wherein a nibbling machine is used for cutting out.

12. Method according to claims 1 or 2 wherein bridge pieces are left between conductors while cutting out the sheet.

13. The method according to claims 1 or 2 wherein said coil after being cut is rolled in order to shape it.

* * * * *